(12) United States Patent
Ji et al.

(10) Patent No.: US 7,772,030 B2
(45) Date of Patent: Aug. 10, 2010

(54) MULTIPURPOSE DECAPSULATION HOLDER AND METHOD FOR A BALL GRID ARRAY PACKAGE

(75) Inventors: Chun Kui Ji, Shanghai (CN); Shan An Liang, Shanghai (CN); Zhi Rong Guo, Shanghai (CN); Min Pan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 157 days.

(21) Appl. No.: 11/615,971

(22) Filed: Dec. 23, 2006

(65) Prior Publication Data

US 2008/0142482 A1    Jun. 19, 2008

(30) Foreign Application Priority Data

Dec. 15, 2006    (CN) .................. 2006 1 0147452

(51) Int. Cl.
| | |
|---|---|
| H01L 21/00 | (2006.01) |
| B26D 5/00 | (2006.01) |
| B29C 65/00 | (2006.01) |
| B32B 37/00 | (2006.01) |
| B32B 41/00 | (2006.01) |
| B65C 9/40 | (2006.01) |
| G05G 15/00 | (2006.01) |

(52) U.S. Cl. .............. 438/106; 156/345.35; 156/345.51
(58) Field of Classification Search ................ 438/255, 438/261
See application file for complete search history.

(56) References Cited

U.S. PATENT DOCUMENTS 5,792,305 A * 8/1998 Winsemius et al. ..... 156/345.11
6,395,129 B1 * 5/2002 Vu et al. ................. 156/345.11

* cited by examiner

*Primary Examiner*—Ha Tran T Nguyen
*Assistant Examiner*—Valerie Brown
(74) *Attorney, Agent, or Firm*—Townsend and Townsend and Crew LLP

(57) ABSTRACT

A method and apparatus for the decapsulation of integrated circuit packages. The apparatus includes a support member, the support member having an open region and an adjustable device coupled to the support member. The adjustable device can be adapted to hold a BGA package such that a surface region of the BGA package is spatially disposed to face a decapsulation source and a plurality of balls on the BGA package remain free from contact from the decapsulation source and free from contact from a thermal source capable of causing damage to one or more of the balls. The decapsulation source is provided to subject a portion of the surface region of the BGA package for removal of the portion of the BGA package.

14 Claims, 13 Drawing Sheets

MULTIPURPOSE DECAPSULATION HOLDER AND METHOD FOR A BALL GRID ARRAY PACKAGE

CROSS-REFERENCES TO RELATED APPLICATIONS

This application claims priority to Chinese Patent Application No. 200610147452.8, filed on Dec. 15, 2006, commonly assigned and hereby incorporated by reference for all purposes.

BACKGROUND OF THE INVENTION

The present invention is directed to integrated circuits and their processing for the manufacture of semiconductor devices. More particularly, the invention provides a method and apparatus for securing a ball grid array (BGA) package so that decapsulation of the package can occur. Merely by way of example, the invention can be used for BGA packages of varying dimensions without having to rely on a separate decapsulation holder for each package size. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. After the individual devices have been manufactured within the IC fabrication facility, the devices must be tested and packaged to ensure the reliability of the manufactured circuits. One technique that can be used to package the manufactured circuits is in a ball grid array (BGA) package, where the circuit is encapsulated within a molding material to protect the circuit from exposure or undesired contact. Solder balls are attached to the base of the package to provide a reliable electrical connection from the integrated circuit.

After a packaging process has been performed on an integrated circuit, it may be necessary to decapsulate or open the package to facilitate analysis or electrical examination of the integrated circuit or the internal features of the package. For example, thermal testing may be performed on the exposed circuit after decapsulation to determine if hotspots are present on the chip after the circuit has been cycled in operation. Another reason for decapsulation of a package can be to check for crossed wires or pinholes within the integrated circuit. A decapsulation process can consist of a purely mechanical process such as prying or cutting away the encapsulant layer, or may be performed using a chemical etch, plasma etch, or thermomechanical removal process to remove the encapsulant layer.

One component of the decapsulation process is to ensure that the BGA package is properly secured and oriented with the decapsulation equipment so that removal can properly occur without any damage to the integrated circuit. A decapsulation holder can be used for this process. However, BGA packages are often manufactured in different sizes to accommodate for the different sizes and shapes of integrated circuits. Different decapsulation holders are used for different sizes of BGA packages, leading to an increased cost as a range of decapsulation holders must be maintained at the IC fabrication facility. Having different decapsulation holders can also lead to longer processing time for circuits, as the decapsulation holder must be switched out for integrated circuits of different sizes before the decapsulation process can occur.

From the above, it is seen that an improved method and apparatus for the decapsulation for semiconductor packages is desired.

BRIEF SUMMARY OF THE INVENTION

The present invention is directed to integrated circuits and their processing for the manufacture of semiconductor devices. More particularly, the invention provides a method and apparatus for securing a ball grid array (BGA) package so that decapsulation of the package can occur. Merely by way of example, the invention can be used for BGA packages of varying dimensions without having to rely on a separate decapsulation holder for each package size. But it would be recognized that the invention has a much broader range of applicability.

In a specific embodiment, an apparatus for the decapsulation of integrated circuit packages is provided. The apparatus includes a support member, the support member having an open region and an adjustable device coupled to the support member. The adjustable device can be adapted to hold a BGA package such that a surface region of the BGA package is spatially disposed to face a decapsulation source and a plurality of balls on the BGA package remain free from contact from the decapsulation source and free from contact from a thermal source capable of causing damage to one or more of the balls. The decapsulation source is provided to subject a portion of the surface region of the BGA package for removal of the portion of the BGA package.

In another embodiment, an apparatus for the decapsulation of integrated circuit packages is provided, The apparatus includes a support member, the support member having an open region and an adjustable device. The adjustable device is adapted to hold a integrated circuit package such that a surface region of the integrated circuit package is spatially disposed to face a decapsulation source Additionally, the adjustable device comprises a first holder configured to move on a first portion of the support member and a second holder configured to move on a second portion of the support member. The decapsulation source is provided to subject a portion of the surface region of the integrated circuit package for removal of the portion of the integrated circuit package.

In yet another embodiment, a method for the decapsulation of BGA packages is provided. The method includes providing a BGA package comprising a surface region and a plurality of solder balls, providing a support member, the support member having an open region, and providing an adjustable device coupled to the support member. The BGA package is secured to the support member using the adjustable device, with the BGA package being oriented towards a decapsulation source and the plurality of solder balls remaining free from mechanical contact with the adjustable device. The surface region of the BGA package is then exposed to the decapsulation source through the open region of the support member.

Many benefits are achieved by way of the present invention over conventional techniques. For example, the present technique provides an easy to use process that relies upon conventional technology. In some embodiments, cost savings can be achieved in that multiple decapsulation holders are not required at the IC manufacturing facility. In other embodiments, processing times may be reduced as the decapsulation holder does not need to be replaced during each decapsulation process to accommodate BGA packages of different sizes. Preferably, the invention provides for a decapsulation method and apparatus that can accommodate for different sizes of BGA packages. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and apparatus for securing a ball grid array (BGA) package so that decapsulation of the package can occur. Merely by way of example, the invention can be used for BGA packages of varying dimensions without having to rely on a separate decapsulation holder for each package size. But it would be recognized that the invention has a much broader range of applicability.

Figure 1:
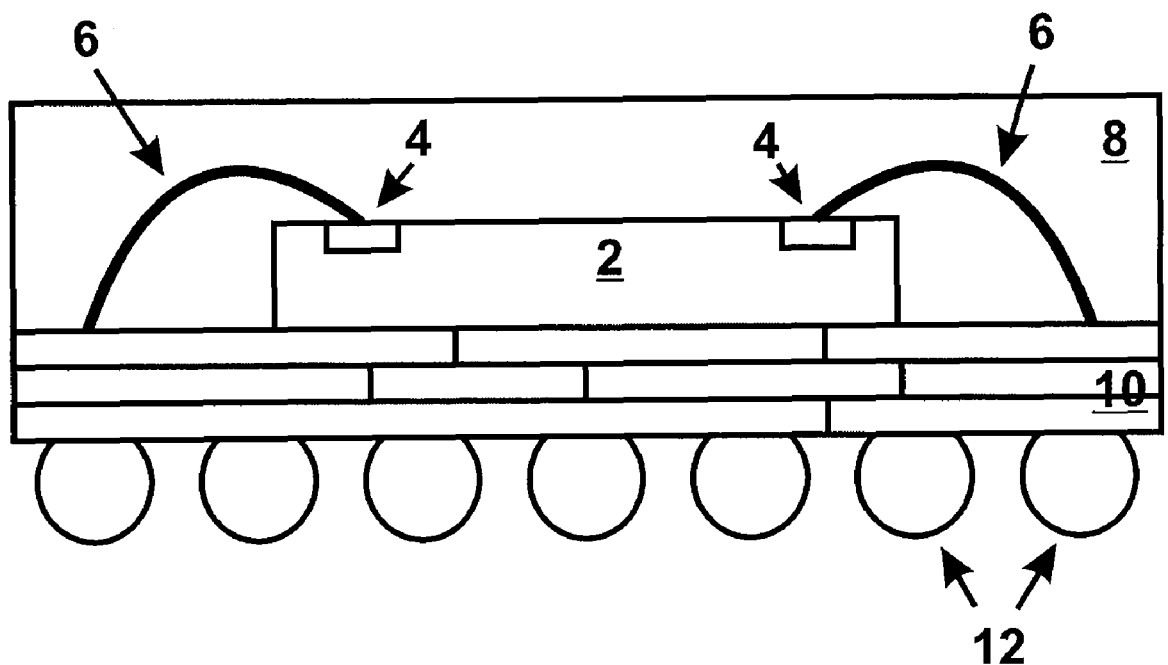
FIG. 1 is a simplified conventional diagram of an integrated circuit coupled to a ball grid array package.

FIG. 1 is a simplified conventional diagram of an integrated circuit coupled to a ball grid array package. BGA package 100 may be one of a variety of specific BGA packages, including but not limited to PBGA, uBGA, full matrix BGA, SBGA, TBGA, CBGA, and FBGA packages. Integrated circuit 2 is first formed on a silicon die and prepared for packaging. Bond pads 4 are formed on a surface region of integrated circuit 2, allowing the circuit to be electrically connected to wiring board 10 through wiring 6. For example, wiring 6 may comprise metallic bond wires which extend from bond pads 4 to wiring board 10. Encapsulant layer 8 is formed covering integrated circuit 2, bond wires 6, and a portion of wiring board 10 in a protective layer that protects integrated circuit 2 and its wiring from the external environment, while still enabling electrical conductivity and heat release through the encapsulant material. For example, encapsulant layer 8 may be formed from an epoxy resin material or plastic material. Wiring board 10 may be a high-performance multilayer wiring board constructed from a laminate material that has several layers of conductors and insulators to provide a plurality of distinct electrical connections from the integrated circuit. Wiring board 10 has an area array of external terminals such as solder balls 10 laid out on a surface region of the package. By arranging solder balls 10 in an array, BGA package 100 can be formed with a large number of high-density terminals.

Figure 2:
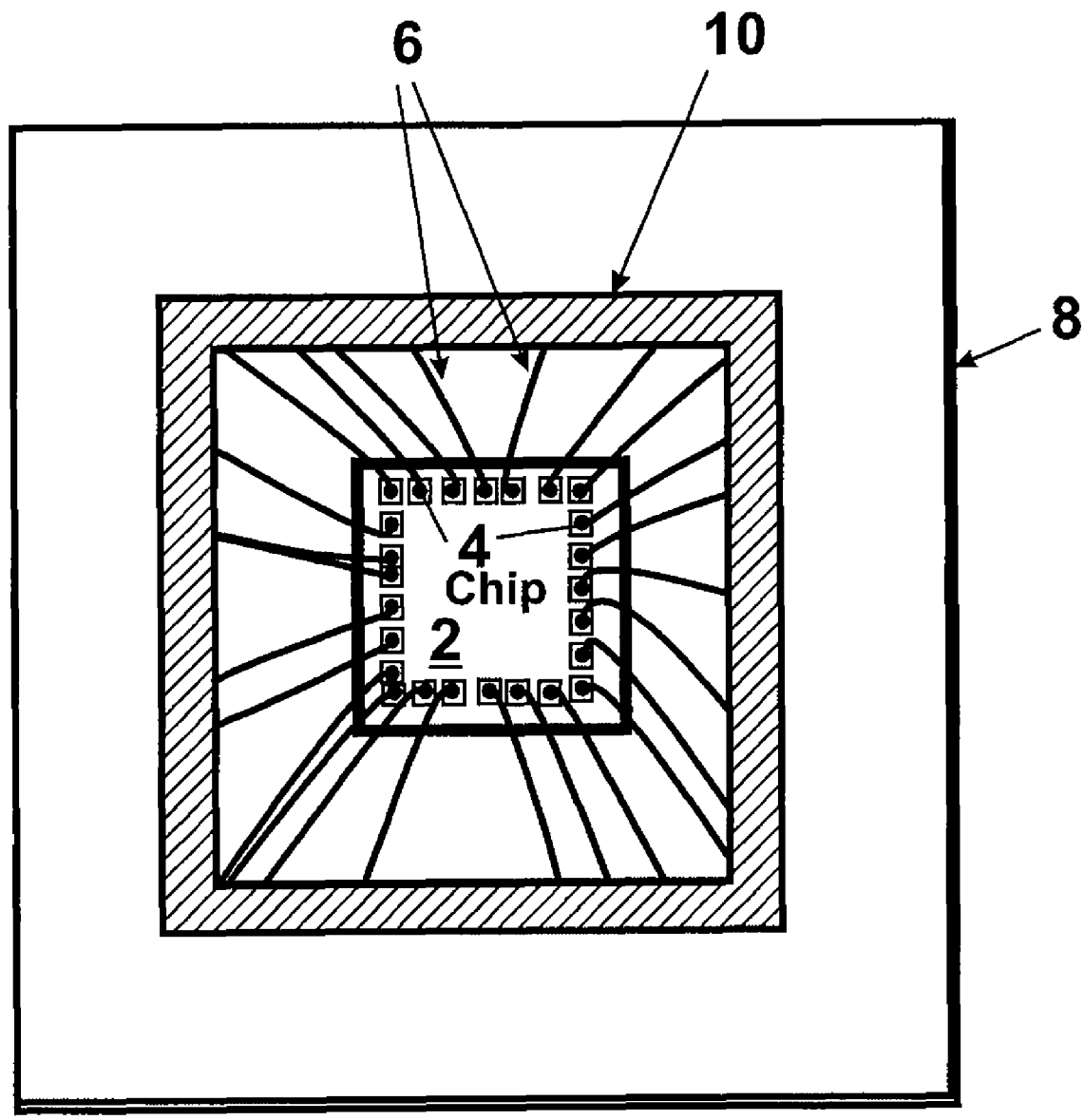
FIG. 2 is a simplified conventional diagram of a top-view of an integrated circuit coupled to a BGA package after decapsulation.

FIG. 2 is a simplified conventional diagram of a top-view of an integrated circuit coupled to a BGA package after decapsulation. A decapsulation process is performed to remove a portion of encapsulant 8 from BGA package 100 to facilitate the inspection or examination of the die and internal features of the package. Following the decapsulation process, integrated circuit 2 and wiring board 10 are exposed so that further testing or analysis of integrated circuit 2 or its wiring can be performed. Bond pad regions 4 on integrated circuit 2 are connected to wiring board 10 through bond wires 6. Portions of encapsulant layer 8 may still present following the decapsulation process.

Figure 3:
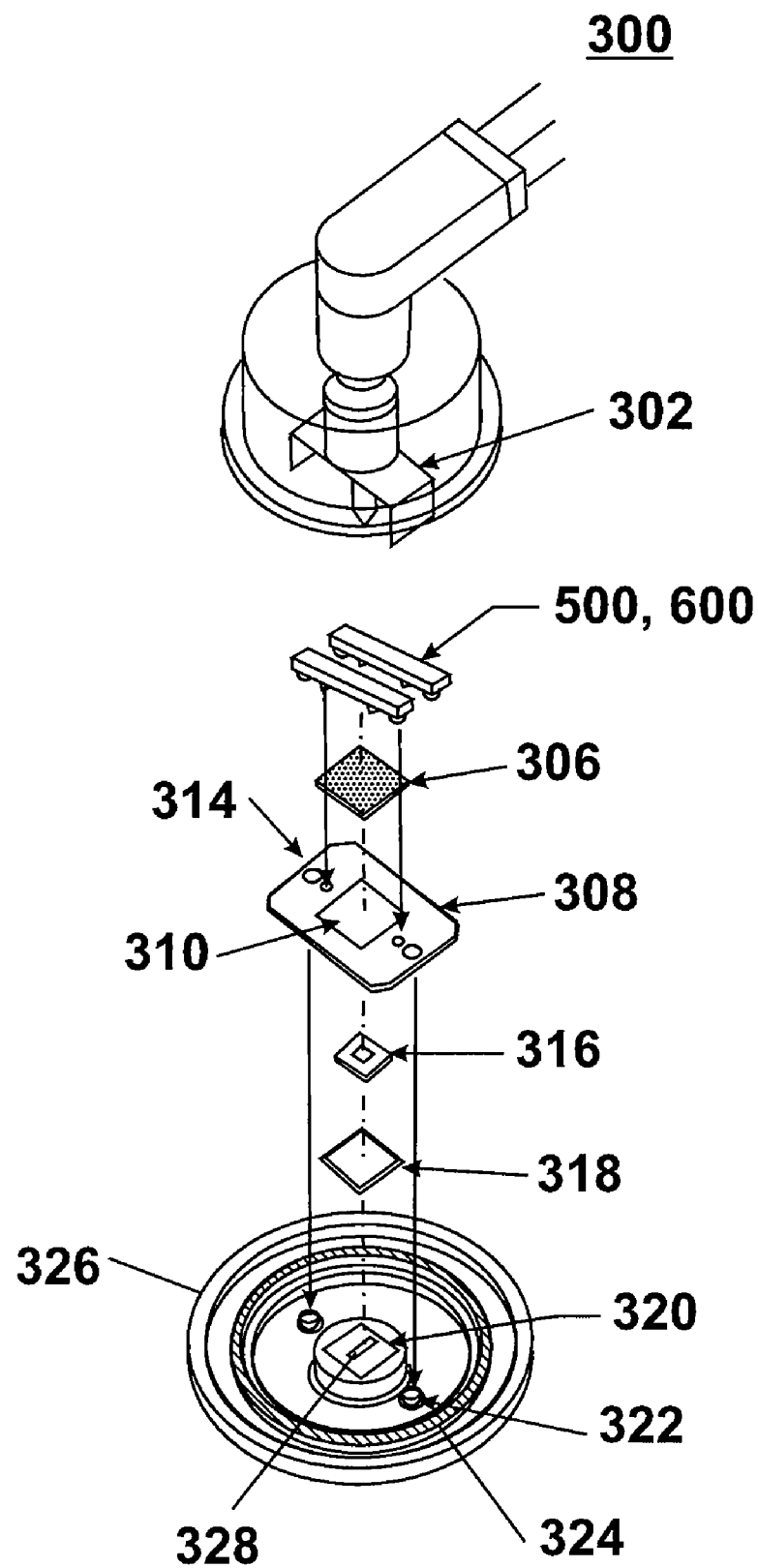
FIG. 3 is a simplified exemplary diagram of a decapsulation apparatus.
Figure 4:
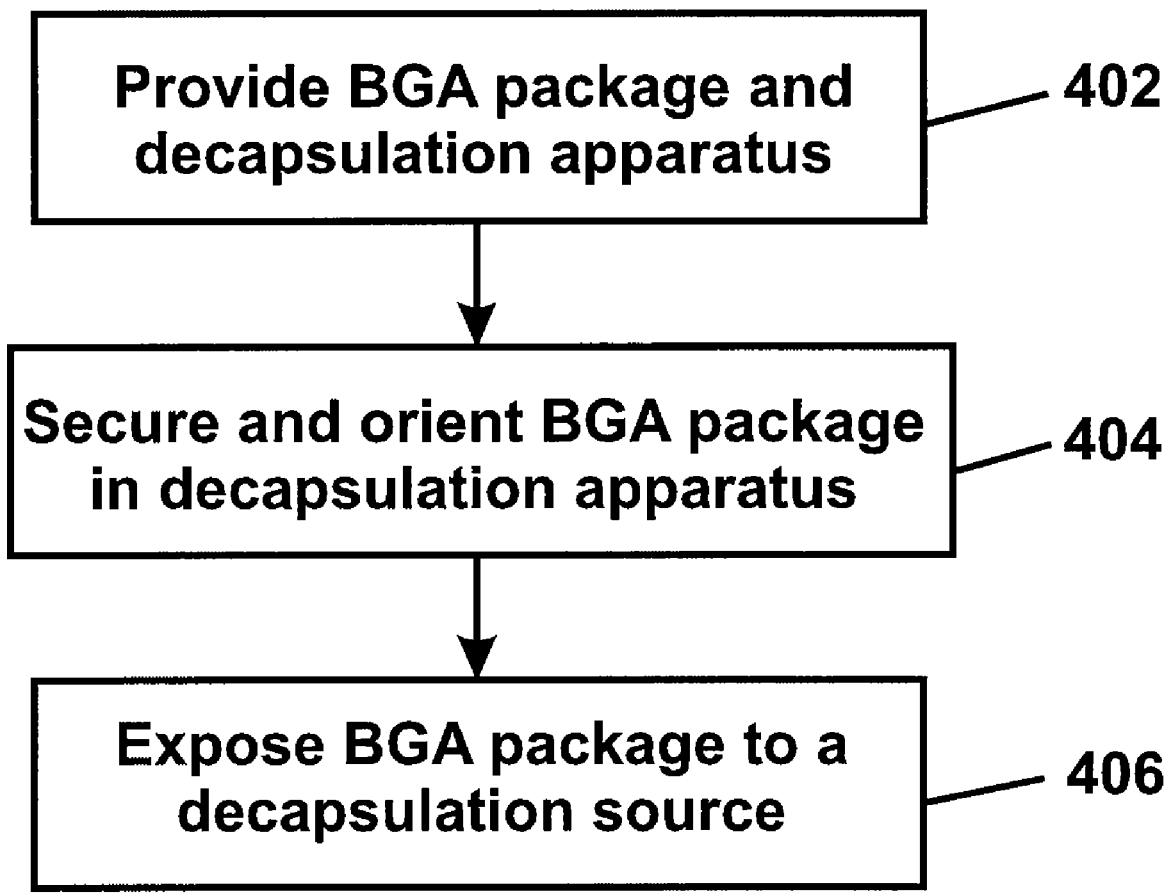
FIG. 4 is a simplified exemplary flowchart of a decapsulation process according to an embodiment of the present invention.

FIG. 3 is a simplified exemplary diagram of a decapsulation apparatus on which decapsulation of a BGA package can be performed. For example, FIG. 3 may be better understood in conjunction with FIG. 4, which is a simplified exemplary flowchart of a decapsulation process according to an embodiment of the present invention. Decapsulation process 400 includes a process 402 of providing the BGA package and decapsulation apparatus, a process 404 for securing and orienting the BGA package in the decapsulation apparatus, and a process 406 for exposing the BGA package to a decapsulation source. This diagram is merely an example, which should not unduly limit the scope of the claims. One of ordinary skill in the art would recognize many variations, alternatives, and modifications.

In process 400, a BGA package 306 containing an integrated circuit to be decapsulated and a decapsulation apparatus 300 are provided. Decapsulation apparatus may comprise a plurality of components used to decapsulate BGA package 306. Sample guide 308 can be used as a support member for BGA package 306. For example, sample guide 308 may have an open region 310 to avoid contacting the solder ball side of BGA package 306 and reduce the potential for electrical problems and potential breakage due to disturbance of the sensitive solder balls. In another example, alignment holes 314 are formed on sample guide 308 to allow for proper alignment of sample guide 308 to decapsulation fixture 320. The alignment procedure may be performed by using guide pins 322 near decapsulation fixture 320. In a specific embodiment, two guide pins 322 are used to secure sample guide 308 to decapsulation platform 326. In another specific embodiment, sample guide 308 may be formed from an aluminum material with a nickel coating. Of course, there can be other variations, modifications, and alternatives.

Packing material 316 is inserted in between the top surface of BGA package 306 and decapsulation fixture 320 as an intermediary layer. BGA package 306 is oriented so that the encapsulant material on BGA package 306 faces decapsulation fixture 320, while the ball grid array side faces sample guide holder 302. For example, packing material 306 may be have a hole within its center to allow the decapsulation source from decapsulation fixture 320 to contact and remove the encapsulated surface of BGA package 306. In another example, packing material 306 may comprise a rubber material which can resist any detrimental effects such as corrosion or structural damage due to contact with the decapsulation source from decapsulation fixture 320. Packing guide 318 can be employed in conjunction with packing material 316 to position packing material 316 between BGA package 306 and decapsulation fixture 320 so that the decapsulation process can occur. In a specific embodiment, packing guide 318 is a frame that couples with decapsulation fixture 320 and allows packing material 316 to be properly positioned. Of course, there can be other variations, modifications, and alternatives.

Decapsulation platform 326 is a structure that comprises at least decapsulation fixture 320. BGA package 306 is secured and oriented towards decapsulation fixture 320 during the decapsulation process. For example, a hot plate (not shown) may also be included on decapsulation platform 326 to provide a thermal component to the decapsulation process. The temperature that the decapsulation process is performed at may be selected so that the temperature is less than the melting point of the solder balls within BGA package 306. In a specific embodiment, the decapsulation process may be performed at a temperature of 100 degrees C., with the melting point of the solder balls within BGA package 306 being 180 degrees C. In another example, decapsulation platform may further comprise guide pins 322 which may be placed through alignment holes 314 on sample guide 308 to improve alignment. In yet another example, decapsulation platform 326 may further comprise a protective ring 324 designed to protect exterior portions of decapsulation platform 326 from exposure to decapsulation fixture 320. In a specific embodiment, protective ring 324 may be made a Teflon or high-resistance rubber material. Of course, there can be other variations, modifications, and alternatives.

Decapsulation fixture 320 may comprise a teflon material or other material that resists detrimental effects due to exposure to the decapsulation source. For example, decapsulation fixture may additionally comprise an exposure source 328 through which the decapsulation source can travel through and contact the exposed surface of BGA package 306. In a specific embodiment, the decapsulation source being deposited through exposure source 328 may be a chemical source such as fuming nitric acid, sulfuric acid, or a mixture of fuming nitric acid and sulfuric acid. In another specific embodiment, the decapsulation source may be a plasma source wherein a plasma is created to remove a portion of the encapsulant material from BGA package 306. Of course, there can be other variations, modifications, and alternatives.

During process 404, decapsulation holders 500, 600 are used to secure BGA package 306 to sample guide 308 for decapsulation. Additionally, decapsulation holders are adapted to hold BGA package 306 such that a surface region of BGA package 306 is spatially disposed to face a decapsulation source. In a specific embodiment, a plurality of balls on the BGA package remains free from contact from the decapsulation source. In another embodiment, the plurality of balls on the BGA package remain free from contact from a thermal source capable of causing damage to one or more of the balls. Additional detail relating to decapsulation holders 500, 600 will be discussed in regards to FIGS. 5-10. Decapsulation apparatus additionally comprises sample guide holder 302, which is coupled to sample guide 308 and decapsulation holders 500, 600. For example, sample guide holder 302 may be a mechanical device to facilitate the automated removal and decapsulation of BGA package 306. Of course, there can be other variations, modifications, and alternatives.

Following process 404 of securing and orienting BGA package 306 in decapsulation apparatus 300, a surface region of BGA package 306 is subjected to the decapsulation source for removal of at least a portion of BGA package 306 in process 406. BGA package 306 can then be removed from decapsulation apparatus 300 and the die and internal features of the package can then be examined.

Figure 5:
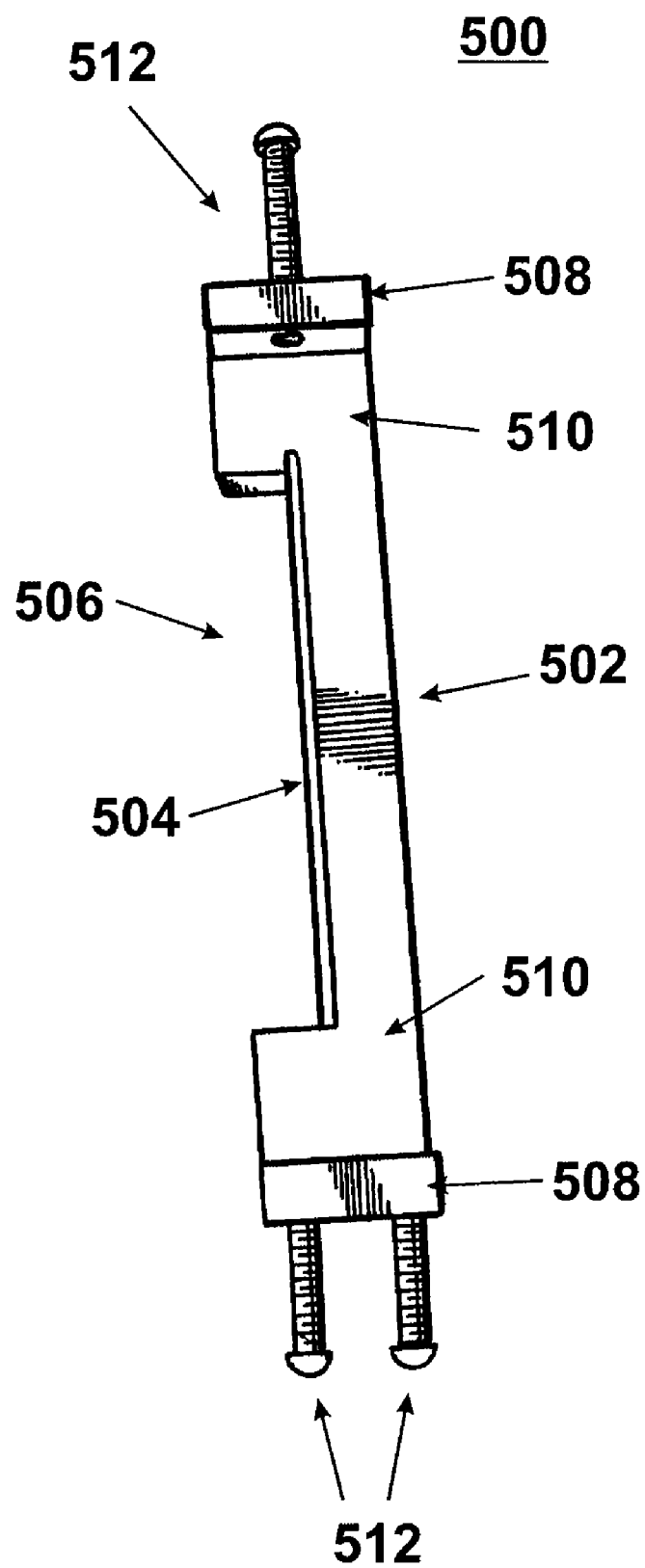
FIGS. 5-6 are simplified exemplary diagrams of a decapsulation holder according to an embodiment of the present invention.
Figure 6:
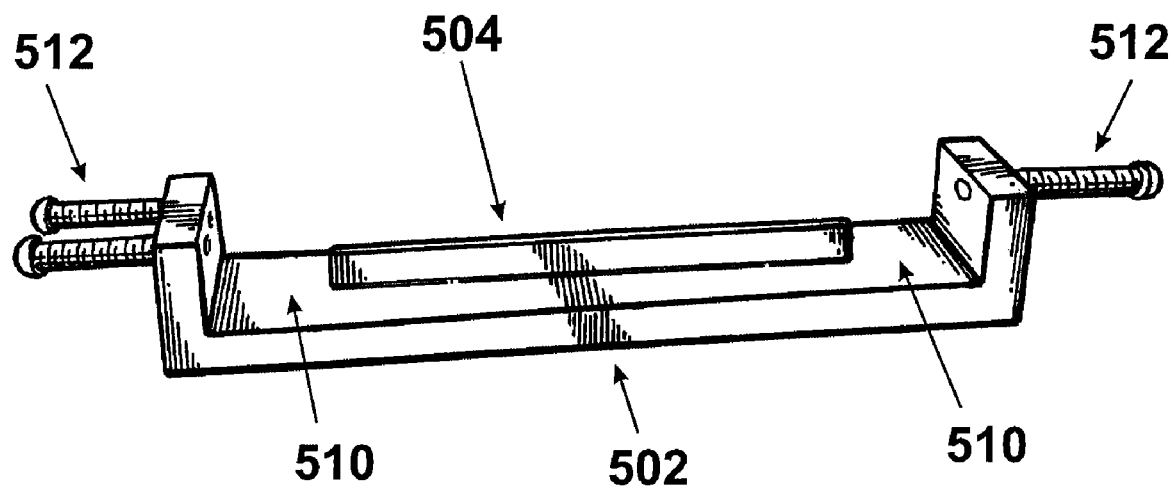

FIGS. 5 and 6 are simplified exemplary diagrams of a decapsulation holder according to an embodiment of the present invention. These diagrams are merely examples, which should not unduly limit the scope of the claims. One of ordinary skill in the art would recognize many variations, alternatives, and modifications. Decapsulation holders 500, 600 may be coupled to sample guide 308 and are used in conjunction for holding BGA package 306 for decapsulation. In a specific embodiment, decapsulation holders 500 and 600 are identical to each other. For example, features shown on decapsulation holder 500 may also have similar features of the same function on decapsulation holder 600. Of course, there can be other variations, modifications, and alternatives.

FIG. 5 shows an upside-down view of decapsulation holder 500. Decapsulation holder 500 possesses a clamping surface 504 which contacts the sides of BGA package 306 which are perpendicular to the solder balls and the surface region to be removed during decapsulation. For example, clamping surface 504 may possess a greater height than flat surfaces 510 to increase the surface area being contacted between clamping surface 504 and sides BGA package 306 during the securing of BGA package 306. The length of clamping surface 504 is longer than typical BGA package lengths to accommodate for a variety of BGA package sizes. Opposite to clamping surface 504 is outside surface 502, which is opposite from the position of BGA package 306. In another example, an indentation 506 may be made to decrease the stress being applied to the wafer during the securing process. In yet another example, decapsulation holder 500 further comprises two elevated ends 508 which have a greater height than flat surfaces 510. Decapsulation holder 500 can be placed on sample guide 310 with elevated ends 508 facing towards decapsulation platform 346. Elevated ends 508 extend further than the height of sample guide 310 which prevents decapsulation holder 500 from moving in an unwanted direction. This can be more clearly seen in FIGS. 7-10. Of course, there can be other variations, modifications, and alternatives.

Securing devices 512 are located on elevated portions 508 of decapsulation holder 500 and allow decapsulation holder 500 to be temporarily secured to sample guide 310 prior to decapsulation and unsecured after decapsulation has been completed. By securing the position of decapsulation holders 500, 600 to sample guide 310, the position of BGA package 306 between decapsulation holders 500, 600 can be set for the decapsulation process. In a specific embodiment, the securing devices may comprise screws that are tightened through screwholes in elevated portions 508 to contact opposite sides of sample guide 310 and secure the position of BGA package 306. While two securing devices 512 have been shown on one side of decapsulation holder 500 and one securing device 512 on the opposite side of decapsulation holder 500, other configurations of securing devices could also be implemented. Of course, there can be other variations, modifications, and alternatives.

Figure 7:
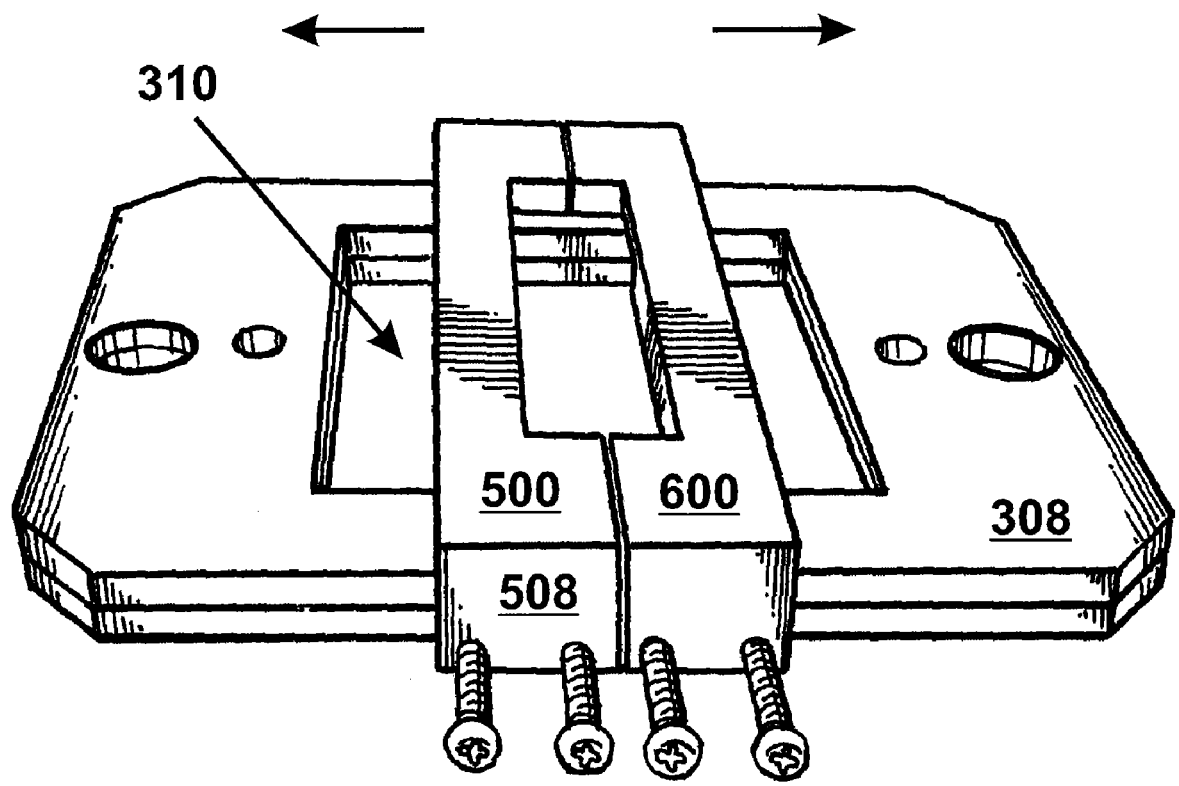
FIG. 7-13 are simplified exemplary diagrams of a decapsulation holder and sample guide according to an embodiment of the present invention.

FIG. 7 is a simplified exemplary diagram of decapsulation holders and a sample guide according to an embodiment of the present invention. This diagram is merely an example, which should not unduly limit the scope of the claims. One of ordinary skill in the art would recognize many variations, alternatives, and modifications. FIG. 7 shows decapsulation holders 500, 600 coupled to sample holder 308. Decapsulation holders 500, 600 are placed on sample holder 308 with elevated portions 508 extending over sample holder 308. Securing surface 508 (not shown in FIG. 7) extends into open region 310 of sample holder 308. Flat regions 510 on decapsulation holders 500, 600 are placed even with the top surface of decapsulation holders 500, 600, enabling decapsulation holders 500, 600 to move laterally in the directions indicated. In a specific embodiment, the direction of motion of the decapsulation holders 500, 600 is lengthwise along the longer side of sample holder 308. In another specific embodiment, the materials for decapsulation holders 500, 600 may be aluminum with a nickel coating. Once the appropriate position of BGA package 306 has been set between decapsulation holders 500, 600 in relation to the decapsulation source, securing devices 512 may be used to secure decapsulation holders 500, 600 and BGA package 306 to sample holder 308. Once decapsulation has been completed, securing devices 512 can be released and decapsulation holders 500, 600 can be moved apart to allow BGA package 306 to be removed from decapsulation apparatus 300. Of course, there can be other variations, modifications, and alternatives.

Figure 8:
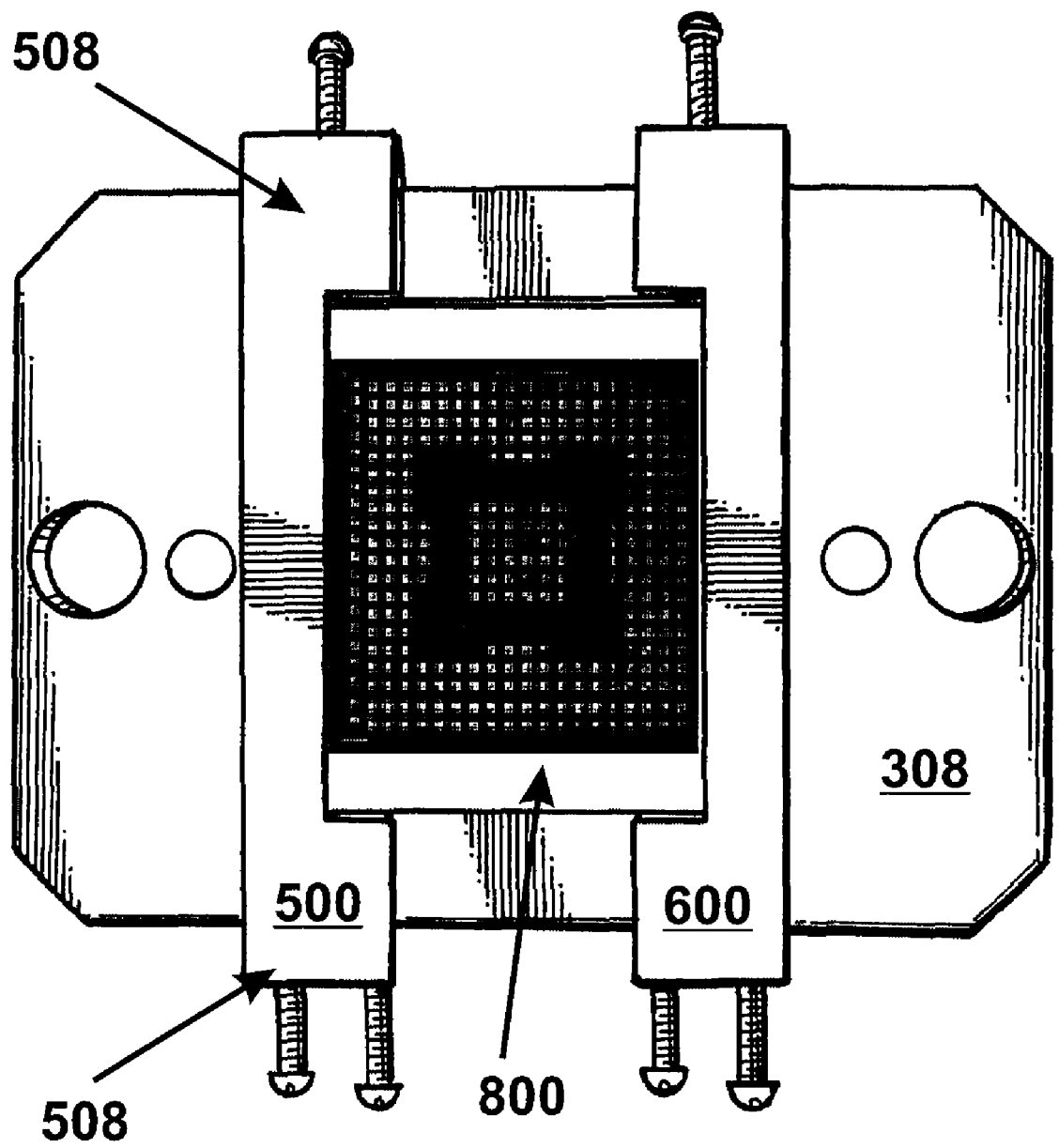
Figure 9:
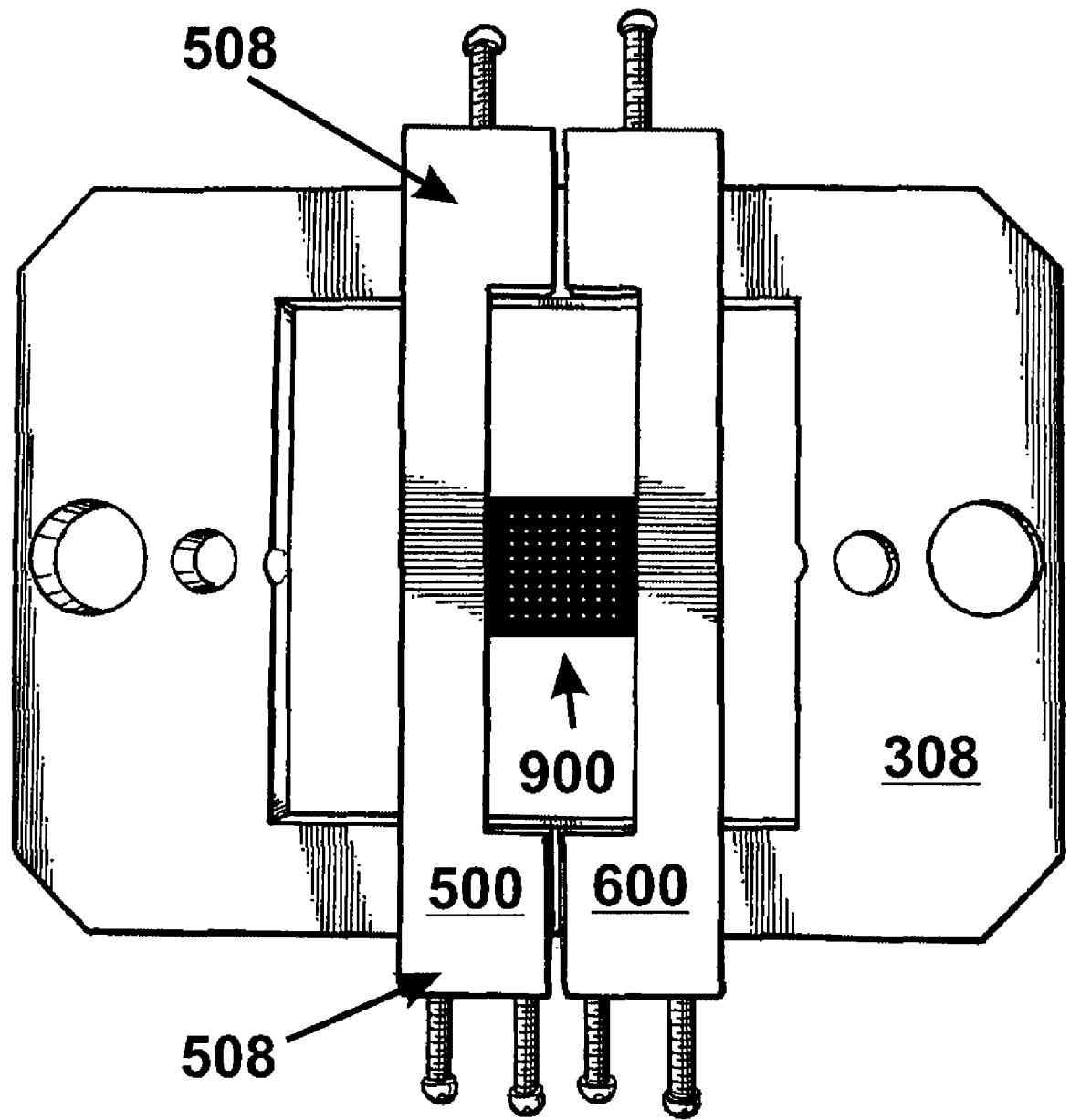
Figure 10:
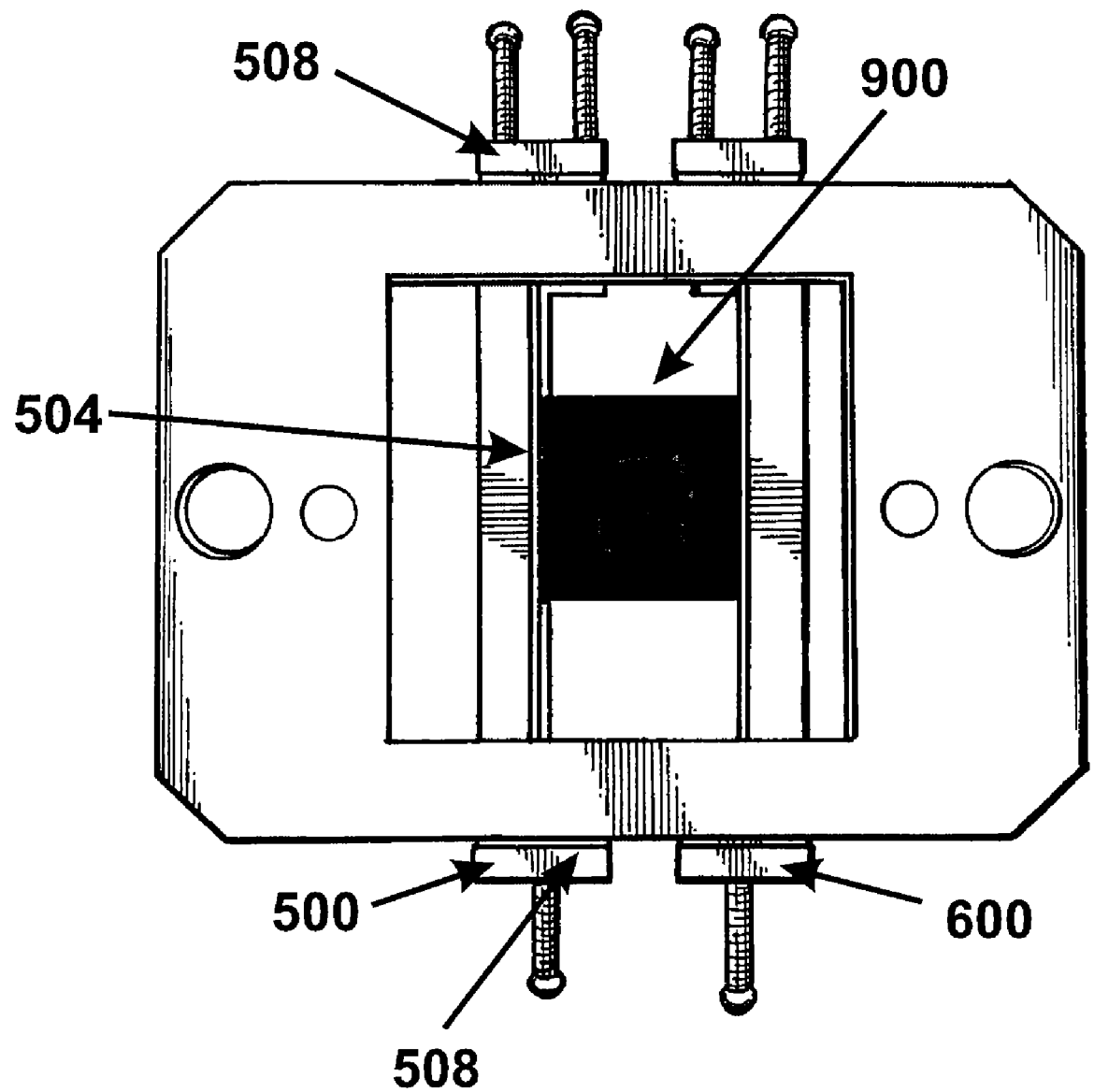

FIGS. 8-10 are simplified exemplary diagrams of decapsulation holders, a sample guide, and a BGA package according to embodiments of the present invention. These diagrams are merely examples, which should not unduly limit the scope of the claims. One of ordinary skill in the art would recognize many variations, alternatives, and modifications. FIG. 8 shows a top-down view of decapsulation holders 500, 600 securing BGA package 800 in place for decapsulation. BGA package 800 is of a large size that can be accommodated by the decapsulation holders 500, 600. In FIG. 9, a much smaller BGA package 900 is secured for decapsulation by decapsulation holders 500, 600. To adequately secure BGA package 900, decapsulation holders 500, 600 are slid on sample holder 308 until securing surfaces 504 contact side surfaces of BGA package 900 with sufficient force to secure BGA package 900. FIG. 10 is a bottom-up view of decapsulation holders 500, 600 securing BGA package 900 in place for decapsulation. Securing surface 504 and elevated portions 508 extend at least partially over the thickness of sample holder 308 to ensure that decapsulation holders 500, 600 and BGA package 900 only move in a lateral direction. Thus, adjustable decapsulation holders 500, 600 can accommodate different sizes of BGA packages instead of utilizing one decapsulation holder for each size of BGA package. Of course, there can be other variations, modifications, and alternatives.

Figure 11:
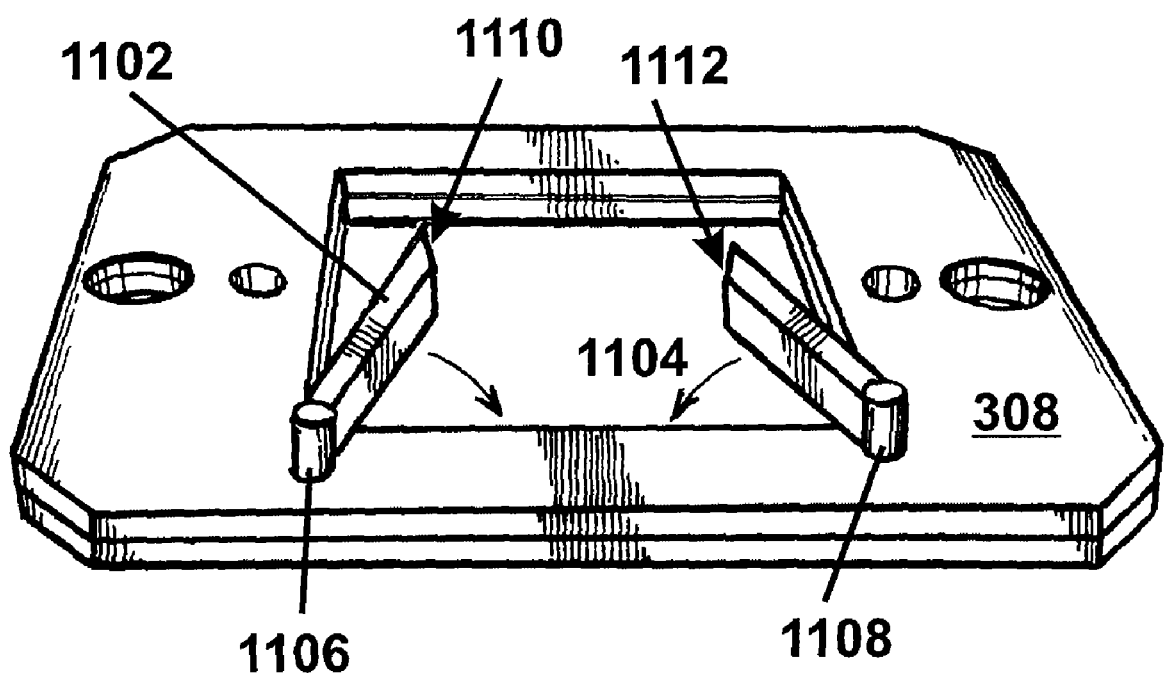

FIG. 11 is a simplified exemplary diagram of a decapsulation holder and sample guide according to an embodiment of the present invention. This diagram is merely an example, which should not unduly limit the scope of the claims. One of ordinary skill in the art would recognize many variations, alternatives, and modifications. Decapsulation holders 1102, 1104 are coupled to sample holder 308 on its top surface. Pivot points 1106, 1108 allow decapsulation holders to swivel in the directions indicated to securely contact the BGA package placed in between. For example, contacting surface 1110, 1112 may possess a flat surface to provide a greater surface area to contact the sides of the BGA package. In another example, contacting surfaces 1110, 1112 at the end of decapsulation holders 1102, 1104 may extend into open region 310 to provide a greater surface area to contact the sides of the BGA package. Pivot points 1106, 1108 may have a spring-loaded or locking mechanism to set the position of decapsulation holders 1102, 1104 to the size of the BGA package. Once decapsulation has been performed, the spring-loaded or locking mechanism can be released to allow the BGA package to be unloaded from decapsulation apparatus 300. In yet another example, one of decapsulation 1102, 1104 holders could be placed diagonally from the other across the open region, with both decapsulation holders swinging toward the center of sample holder 308 to contact the BGA package. Of course, there can be other variations, modifications, and alternatives.

Figure 12:
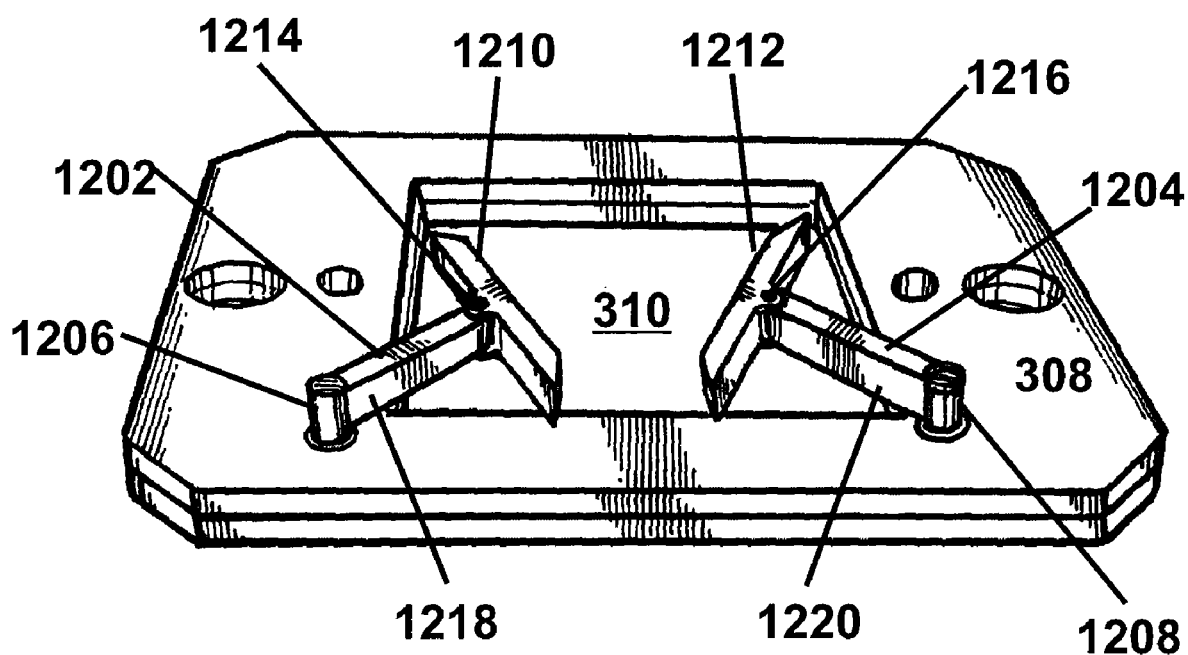

FIG. 12 is a simplified exemplary diagram of a decapsulation holder and sample guide according to an embodiment of the present invention. This diagram is merely an example, which should not unduly limit the scope of the claims. One of ordinary skill in the art would recognize many variations, alternatives, and modifications. Decapsulation holders 1202, 1204 are coupled to sample holder 308 on its top surface. Pivot points 1206, 1208 allow decapsulation holders 1202, 1204 to swivel in the directions indicated to securely contact BGA package 306 placed in between. Decapsulation shafts 1218, 1220 are connected to pivot points 1206, 108 and 1214, 1216 at both ends, allowing for two ranges of motion to contact BGA package 306. Decapsulation holders 1202, 1204 additionally comprise contacting surfaces 1210, 1212, which can pivot on pivot points 1214, 1216. The two ranges of motion provided by the two pairs of pivot points allows a large portion of contacting surfaces 1210, 1212 to come in contact with the BGA package. For example, pivots 1206, 1208 can be rotated to initially secure the BGA package, and pivots 1214, 1216 can be rotated to allow contacting surfaces 1210, 1212 an additional point of articulation to more fully secure the BGA package. For example, contacting surfaces 1210, 1212 may possess a flat surface to provide a greater surface area to contact the sides of the BGA package. In another example, contacting surfaces 1210, 1212 at the end of decapsulation holders 1202, 1204 may extend into open region 310 to provide a greater surface area to contact the sides of the BGA package. Pivot points 1206, 1208 may have a spring-loaded or locking mechanism to set the position of decapsulation holders 1202, 1204 to the size of the BGA package. Once decapsulation has been performed, the spring-loaded or locking mechanism can be released to allow the BGA package to be unloaded from the decapsulation apparatus. In yet another example, one of the decapsulation holders could be placed diagonally from the other across the open region, with both decapsulation holders swinging toward the center of sample holder 308 to contact the BGA package. Of course, there can be other variations, modifications, and alternatives.

Figure 13:
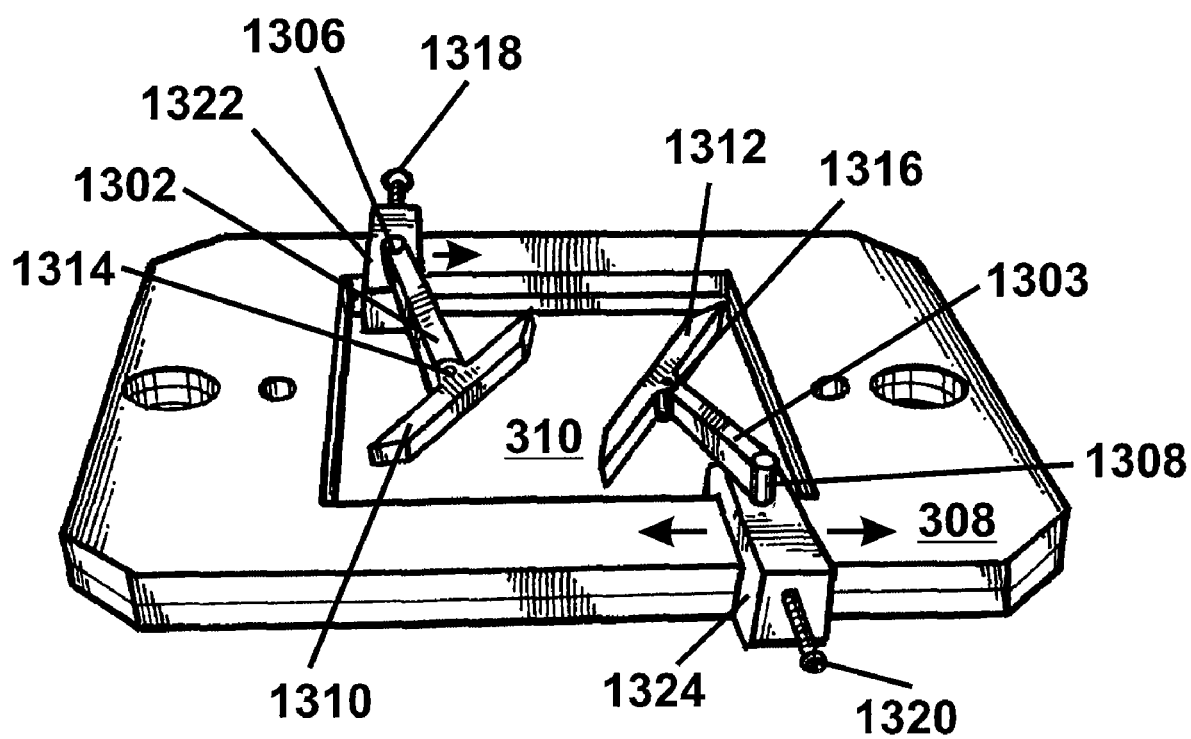

FIG. 13 is a simplified exemplary diagram of a decapsulation holder and sample guide according to an embodiment of the present invention. This diagram is merely an example, which should not unduly limit the scope of the claims. One of ordinary skill in the art would recognize many variations, alternatives, and modifications. Decapsulation holders 1302, 1304 are movably coupled to sample holder 308 on its top surface. Base portions 1322, 1324 contact the exterior perimeter of sample holder 308 at one side and open region 310 at a second side to allow decapsulation holders 1302, 1304 to side laterally along sample holder 308. Pivot points 1306 and 1308 allow decapsulation holders 1302, 1304 to swivel in the directions indicated to securely contact a BGA package placed in between. Decapsulation shafts 1318, 1320 are connected to pivot points 1306, 1308 and 1314, 1316 at both ends, allowing for two ranges of motion to contact the BGA package. Decapsulation holders 1302, 1304 additionally comprise contacting surfaces 1310, 1312, which can pivot on pivot points 1314 and 1316. The two ranges of motion provided by the two pairs of pivot points allows a large portion of contacting surfaces 1310, 1312 to come in contact with the BGA package. For example, pivots 1306, 1308 can be rotated to initially secure the BGA package, and pivots 1314 and 1316 can be rotated to allow contacting surfaces 1310 and 1312 an additional point of articulation to fully secure the BGA package. For example, contacting surface 1310 and 1312 may possess a flat surface to provide a greater surface area to contact the sides of the BGA package. In another example, contacting surface 1310 and 1312 at the end of decapsulation holders 1302 and 1304 may extend into open region 310 to provide a greater surface area to contact the sides of the BGA package. Pivot points 1306 and 1308 may have a spring-loaded or locking mechanism to set the position of decapsulation holders 1302 and 1304 to the size of the BGA package. Once decapsulation has been performed, the spring-loaded or locking mechanism can be released to allow the BGA package to be unloaded from the decapsulation apparatus. Of course, there can be other variations, modifications, and alternatives. In yet another example, one of the decapsulation holders could be placed diagonally from the other across the open region, with both decapsulation holders swinging toward the center of sample holder 308 to contact the BGA package. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for the decapsulation of BGA packages, the apparatus comprising:
    a support member, the support member having an open region;
    an adjustable device coupled to the support member, the adjustable device comprising a first movable member and a second movable member operably slidable on the support member, a first pivot member pivotally attached to the first movable member and a second pivot member pivotally attached to the second movable member, the adjustable device being adapted to hold a BGA package between a portion of the first pivot member and a portion of the second pivot member on a surface region of the support member such that a surface region of the BGA package is spatially disposed to face a decapsulation source and a plurality of balls on the BGA package remain free from contact from the decapsulation source and free from contact from a thermal source capable of causing damage to one or more of the balls; and
    wherein the decapsulation source is provided to subject a portion of the surface region of the BGA package for removal of the portion of the BGA package.

2. The apparatus of claim 1 wherein the support member comprises an aluminum material with a nickel coating.

3. The apparatus of claim 1 wherein the decapsulation source is a chemical source.

4. The apparatus of claim 3 wherein the chemical source is selected from a group consisting of fuming nitric acid, sulfuric acid, or a mixture of fuming nitric acid and sulfuric acid.

5. The apparatus of claim 1 wherein the decapsulation source is a plasma source.

6. The apparatus of claim 1 wherein the adjustable device comprises a first holder and a second holder, the first holder being movably configured on a first portion of the support member and the second holder being movably configured on a second portion of the support member.

7. The apparatus of claim 6 wherein the first holder is a first metal holder configured to slide on the first portion of the support member and the second holder is a second metal holder configured to slide on the second portion of the support member.

8. The apparatus of claim 7 wherein the BGA package is coupled between a first portion of the first holder and a second portion of the second holder.

9. The apparatus of claim 1 wherein the adjustable device comprises a first holder and a second holder, the first holder being configured to rotate on a first portion of the support member and the second holder being configured to rotate on a second portion of the support member.

10. The apparatus of claim 9 wherein the BGA package is coupled between a first portion of the first holder and a second portion of the second holder.

11. The apparatus of claim 6 wherein the first and second holders are temporarily secured to the support member during a decapsulation process by a securing device.

12. The apparatus of claim 1 wherein the BGA package further comprises one selected from a group consisting of PBGA, uBGA, full matrix BGA, SBGA, TBGA, CBGA, and FBGA.

13. The apparatus of claim 1 wherein the plurality of balls are free from mechanical contact with any portion of the adjustable device.

14. An apparatus for the decapsulation of integrated circuit packages, the apparatus comprising:
    a support member, the support member having an open region and a surface region;
    an adjustable device, the adjustable device being adapted to hold a integrated circuit package on the surface region of the support member such that a surface region of the integrated circuit package is spatially disposed to face a decapsulation source, the adjustable device comprising a first holder element configured to pivot on a first portion of the support member and a second holder element configured to pivot on a second portion of the support member; and
    wherein the decapsulation source is provided to subject a portion of the surface region of the integrated circuit package for removal of the portion of the integrated circuit package.

* * * * *